United States Patent
Visser et al.

(10) Patent No.: US 8,344,807 B2
(45) Date of Patent: Jan. 1, 2013

(54) DISTRIBUTED LOW NOISE AMPLIFIER

(75) Inventors: Barend Visser, Potchefstroom (ZA);
Petrus Paulus Kruger, Vredefort (ZA);
Ocker Cornelius De Jager,
Potchefstroom (ZA)

(73) Assignee: North-West University (ZA)

( * ) Notice: Subject to any disclaimer, the term of this patent is extended or adjusted under 35 U.S.C. 154(b) by 0 days.

(21) Appl. No.: 12/680,771

(22) PCT Filed: Oct. 1, 2008

(86) PCT No.: PCT/IB2008/053997
§ 371 (c)(1),
(2), (4) Date: Jun. 25, 2010

(87) PCT Pub. No.: WO2009/044353
PCT Pub. Date: Apr. 9, 2009

(65) Prior Publication Data
US 2010/0283546 A1    Nov. 11, 2010

(30) Foreign Application Priority Data
Oct. 1, 2007  (ZA) .................................. 2007/08363

(51) Int. Cl.
*H03F 3/60* (2006.01)
(52) U.S. Cl. .......................... 330/286; 330/295; 330/54
(58) Field of Classification Search .................. 330/286, 330/53–54, 124 R, 295, 310, 84
See application file for complete search history.

(56) References Cited

U.S. PATENT DOCUMENTS

| 5,365,197 | A | 11/1994 | Ikalainen | |
|---|---|---|---|---|
| 6,597,243 | B1 * | 7/2003 | Fratti | 330/54 |
| 6,819,181 | B2 * | 11/2004 | Stengel et al. | 330/286 |
| 7,129,783 | B2 * | 10/2006 | Young et al. | 330/286 |
| 7,279,980 | B2 * | 10/2007 | Heydari et al. | 330/286 |
| 2003/0201830 | A1 | 10/2003 | Stengel et al. | |
| 2004/0056689 | A1 | 3/2004 | Stengel | 327/1 |

FOREIGN PATENT DOCUMENTS
WO   WO 01/20778 A   3/2001

OTHER PUBLICATIONS

International Search Report dated Mar. 31, 2009, issued in corresponding international application No. PCT/IB2008/053997.
The People's Republic of China Office Action, dated May 11, 2012, issued in corresponding Chinese Application No. 200880110012.2. Total 7 pages.

* cited by examiner

*Primary Examiner* — Hieu Nguyen
(74) *Attorney, Agent, or Firm* — Ostrolenk Faber LLP

(57) ABSTRACT

A distributed low noise amplifier (DLNA) comprises at least a first amplifier part 30.1 providing a first path 36.1 form an input of the amplifier to an output of the amplifier and a second amplifier part 30.2 providing a second path 36.2 from the input to the output. Each of the first and second paths being associated with a respective and different change in phase. The difference being larger than degrees in a noise suppression band to cause a phase difference between noise generated by the amplifier arrangement propagating along the first and second paths and destructive interference of the noise before the output of the DLNA, thereby to suppress noise in the noise suppression band. The respective gains of the amplifier parts 30.1 to 30.n may decrease in a direction from the input of the amplifier to the output thereof.

18 Claims, 11 Drawing Sheets

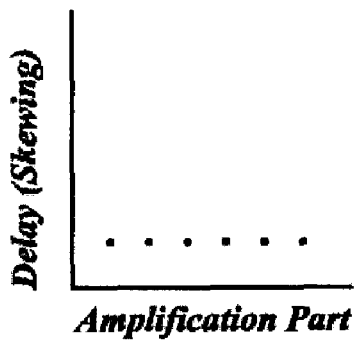 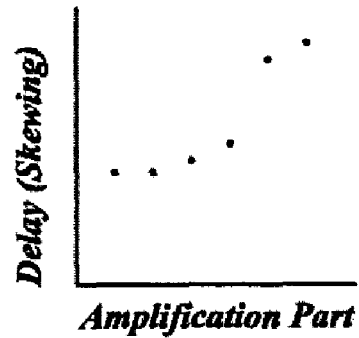
FIGURE 15a        FIGURE 16a
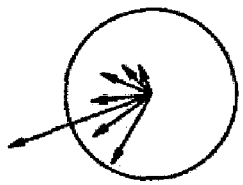 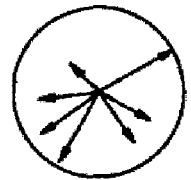
FIGURE 15b        FIGURE 16b
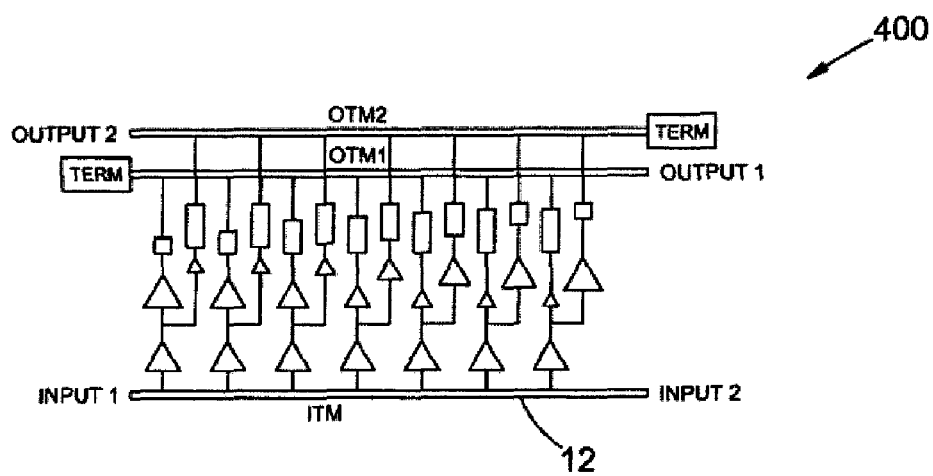
FIGURE 17

Table 1: Comparison of the gain, noise and minimum noise figure for different ideal distributed amplifier configurations

| | | Formula | Constant Gain | Exponential Gain | Skewing |
|---|---|---|---|---|---|
| Gain | $A$ | | 1 | $A(i) = Ae_1^{-a}$, with $r = e^{-a} < 1$ | $A(i) = A_1 e^{-rk} e^{-jik}$ |
| | $A$ | $\left[\sum_{i=1}^{n} Ai\right]^2$ | $n^2 A_1^2$ | $\frac{1}{a^2} A_1^2$ | $\frac{1}{r^2 + t^2} A_1^2$ |
| Output Noise | $N_o$ | $\sum_{i=1}^{n} [A_i]^2 N_{1,o}$ | $n N_{1,o}$ | $\frac{1}{2a} N_{1,o}$ | $\frac{1}{2\sqrt{r^2 + t^2}} N_{1,o}$ |
| Input Noise | $N_i$ | $\sum_{i=1}^{n} \left[\sum_{j=i+1}^{n} A_j\right]^2 N_{1,i}$ | $\frac{n(n-1)(2n-1)}{6} N_{1,i}$ | $\frac{1}{2a^3} N_{1,i}$ | $\frac{1}{2(r^2+t^2)^{3/2}} N_{1,o}$ |
| Optimum Noise Figure | $NF_{min}$ | $\frac{N_i + N_o}{A}$ | $\sqrt{N_0 N_i} \left(\frac{2}{\sqrt{3}} + C_{re}\right)$ | $\sqrt{N_0 N_i}(1 + C_{re})$ | $\sqrt{N_0 N_i}\left(\sqrt{1 - C_{im}^2} + C_{re}\right)$ |
| Optimum Point | $x_{opt}$ | $\frac{d(NF)}{dx_{opt}} = 0$ | $n_{opt} \propto \sqrt{3 N_{1,o} / N_{1,i}}$ | $a_{opt} \propto \sqrt{N_{1,i} / N_{1,o}}$ | $r = \sqrt{1 - C_{im}^2} z$, $t = -C_{im} z$ with $z = \sqrt{\frac{N_{1,i}}{N_{1,o}}} Z_i g_m$ |

DISTRIBUTED LOW NOISE AMPLIFIER

CROSS REFERENCE TO RELATED APPLICATIONS

The present application is a 35 U.S.C. §371 National Phase conversion of PCT/IB2008/053997, filed Oct. 1, 2008, which claims benefit of South African Application No. 2007/08363, filed Oct. 1, 2007, the disclosure of which is incorporated herein by reference. The PCT International Application was published in the English language.

INTRODUCTION AND BACKGROUND

This invention relates to low noise amplifiers and more particularly to a distributed low noise amplifier. The amplifiers may typically, but not exclusively, find application in radio telescope applications.

The current trend in radio telescopes is to build telescopes with high sensitivity over broad bandwidths. To reach high sensitivities, very large collection areas and ultra low noise amplifiers are required. The large collection area comprises hundreds of smaller receivers, each having a respective low noise amplifier (LNA). The LNA must therefore not only have a low noise figure over a broad bandwidth, but must also be linear over a large dynamic range and not be very expensive.

To the best of the applicant's knowledge, almost all the LNA's used in radio telescopes are harmonic LNA's. These harmonic LNA's comprises a single transistor in the first amplification stage. At each frequency, the transistor has a minimum noise figure, $F_{min}$, which is achieved when the transistor is connected to an input impedance $Z_{opt}$. An impedance matching circuit is therefore required to match the amplifier's input impedance to the transistor's optimum low noise impedance, $Z_{opt}$. Harmonic amplifiers have two main disadvantages. Firstly, due to the harmonic nature of the impedance matching circuit, the LNA's low noise performance degrades over large bandwidths and secondly, the impedance matching circuit also results in signal loss, insertion loss and additional noise generated by the circuit.

Another well-known amplifier arrangement is the distributed amplifier. Distributed amplifiers are capable of very large amplification bandwidths and have better linearity and dynamic range than harmonic amplifiers. They are therefore ideally suited as broadband amplifiers in radio telescopes, except for their noise figure. It is well known that distributed LNA's (DLNA) have a higher noise figure than harmonic LNA's.

A distributed amplifier comprises an input transmission medium with an input for the amplifier at one end thereof, an output transmission medium with an output for the amplifier at one end thereof and a number of amplifier parts, with the input of each amplifier part connected to the input transmission medium and the output of the amplifier part to the output transmission medium. The input transmission medium, together with the input impedance of the amplifier parts, which is normally capacitive, form a transmission line. When a signal is applied to the amplifier, it propagates along the input transmission medium. As the signal passes each part, it is amplified and added to the output transmission medium.

In a normal distributed amplifier, the amplified signals are added in phase on the output transmission medium. In other words, the signals from each amplifier part arrive at the same time at the output of the amplifier. The time delay from the input, through each amplifier part, to the output is the same for each part (that is when the difference is much less than the period of the input signal). For an ideal distributed amplifier, having n parts, each with a voltage gain of $A_{v1}$, the total power gain is $A \propto (A_{v1}n)^2$. With the ideal, it is assumed that no other component, besides the amplifier parts, generate noise and that there is no signal loss on the transmission mediums.

However, each amplifier part also generates noise that is transferred to the output transmission medium. If each part transfer has a noise power of $N_{1,o}$, the total noise added tot the output transmission medium is $N_o = N_{1,o} n$, because the noise of the amplifier parts is uncorrelated. The noise figure (or noise-signal ratio) therefore decreases inversely to the number of parts $N_o/A \propto 1/n$.

But some noise generated by each part is also transferred to the input transmission medium. This input noise is then amplified by the other parts and added to the output transmission medium, similar to the signal, giving an amplified input noise $N_{1,i} \propto n^2$ at the output. The total amplified input noise is then $N_i \propto n^3$ for many parts.

Therefore, as the number of part increases, the output noise-signal ratio decreases, but the amplified input noise-signal ratio increases. A distributed amplifier has therefore an optimum number of parts, for which the total noise-signal ratio is a minimum.

There is some correlation between the input and output noise of an amplifier part, because the noise is generated by a common noise source. Let $C = C_{re} + jC_{im}$ be the complex correlation coefficient. When the delay through the amplifier parts is the same, the phase of the correlation between the correlated part of the output noise $N_{1,o}$ and amplified input noise $N_{1,i}$ is the same as the phase between the input and output noise. Only the real part (in-phase part) of C then gives noise cancellation, so that the minimum noise figure of an ideal distributed amplifier is proportional to $1 - C_r$.

By using the right input impedance in harmonic LNA's, $Z_{opt}$, the input noise is reflected back to the transistor, such that the correlated part is in phase with the output noise. The amplified input noise then cancels a large part of the output noise, resulting in a noise figure proportional to $\sqrt{N_{1,i} N_{1,o}} (\sqrt{1 - C_{im}^2} - C_{re})$. For High Electron Mobility Transistors (HEMT) used in noise amplifiers, $C_{im}$ is close to 1, so that the noise of a harmonic amplifier is much lower than the noise of a distributed amplifier.

OBJECT OF THE INVENTION

Accordingly, it is an object of the present invention to provide an alternative distributed low noise amplifier with which the applicants believe the aforementioned disadvantages may at least be alleviated.

SUMMARY OF THE INVENTION

According to the invention there is provided a distributed amplifier having an amplification bandwidth extending from a first frequency to a second higher frequency, the distributed amplifier comprising:

an input transmission medium having a first end and a second end and providing an input for the amplifier at the first end;

an output transmission medium having a first end and a second end and providing an output for the distributed amplifier at the second end;

an amplifier arrangement comprising at least first and second amplifier parts connected at an input of the arrangement to the input transmission medium and at an output of the arrangement to the output transmission medium, to provide at least first and second paths for an input signal from the input of the distributed amplifier to the output of the distributed amplifier;

The first path being associated with a first change in phase and the second path being associated with a second change in phase and there being a difference between the first change and the second change; and the difference being larger than 30 degrees for frequencies in a noise suppression band to cause a phase difference between noise generated by the amplifier arrangement propagating along the first and second paths and destructive interference of the noise before the output of the distributed amplifier, thereby to suppress noise in the noise suppression band.

The different phase changes may be caused by each of the first and second paths being associated with a first time delay and a second time delay respectively, and there being a difference between the first time delay and the second time delay, the difference being larger than an inverse of twelve times the second frequency.

A difference of larger than the inverse of twelve times the second frequency, equates to a phase difference of larger than 30 degrees. Preferably the difference is larger than 45 degrees, more preferably larger than 60 degrees and most preferably about 90 degrees.

Hence, according to another aspect of the invention, there is provided a distributed amplifier having an amplification bandwidth extending from a first to a second higher frequency, the distributed amplifier comprising:

an input transmission medium having a first end and a second end and providing an input for the distributed amplifier at the first end;

an output transmission medium having a first end and a second end and providing an output for the distributed amplifier at the second end;

an amplifier arrangement comprising at least first and second amplifier parts connected at an input of the arrangement to the input transmission medium and at an output of the arrangement to the output transmission medium, to provide first and second paths for an input signal from the input of the distributed amplifier to the output of the distributed amplifier;

the first path being associated with a first time delay and the second path being associated with a second time delay, there being a difference between the first time delay and the second time delay; and the difference being larger than an inverse of twelve times the second frequency for frequencies in a noise suppression band to cause a phase difference between noise generated by the amplifier arrangement propagating along the first and second paths and destructive interference of the noise before the output of the distributed amplifier, thereby to suppress noise in the noise suppression band.

The first amplifier part may be connected closer to the input of the distributed amplifier than the second amplifier part and the first amplifier part preferably has a gain higher than a gain of the second amplifier part.

The distributed amplifier may comprise more than the first and second amplifier parts and the gains of respective subsequent amplifier parts may decrease, for example linearly, alternatively exponentially in a direction towards the output of the distributed amplifier.

In a conventional DLNA, the amplifier parts closest to the output of the amplifier contribute more to the amplified input noise than the parts closest to the input of the amplifier, because an amplifier part amplifies the input noise of all the preceding parts. On the other hand, in a conventional distributed amplifier, all the parts have the same contribution towards the output signal and output noise. Therefore, using a lower gain for the parts closest to the amplifier output relative to the parts closest to the amplifier input, the amplified input noise is reduced more than the input signal, resulting in a lower noise figure for the DLNA.

For an ideal distributed amplifier with many parts, when the gain decreases exponentially for each part along the input transmission medium, the minimum noise figure of the amplifier is reduced by a factor $\sqrt{3/2}$. Table 1, shown in FIG. 21, compares the gain, input and output noise and minimum noise figure for an ideal conventional distributed amplifier, having the same gain for each amplifier part, and for an ideal distributed amplifier having an exponentially decreasing gain.

The decreasing gain may be implemented by either the amplifier parts or the transmission mediums or a combination of both. One implementation in the amplifier part is to use in subsequent (towards the output) parts an increasing value resistor or decreasing value capacitor between an output of an amplifying device of the part and the output transmission medium. Using a resistor has the benefit of stabilizing the amplifier at high frequencies, but may introduce additional noise. When using a dual gate transistor, a resistor on the second gate may be used to reduce the gain and may also stabilize the transistor.

The gain change may also be implemented by letting the impedance of the output transmission medium taper from a high to low impedance, when using amplifier parts with a high output impedance (acting like a current source).

Hence, each amplifier part may be associated with a gain against frequency profile and the profile may decay faster for higher frequencies than for lower frequencies.

When using the same semiconductor devices in the amplifier parts, the biasing point of the devices may be different, to realise the decreasing gain. Different semiconductor devices may also be used in the amplifier parts, for example by using small, high frequency devices for the first amplifier parts that is important for amplifying high frequencies and using larger devices at the last parts for amplifying the lower frequencies and terminating the input transmission medium.

BRIEF DESCRIPTION OF THE ACCOMPANYING DIAGRAMS

The invention will now further be described, by way of example only, with reference to the accompanying diagrams wherein.

Figure 8A:
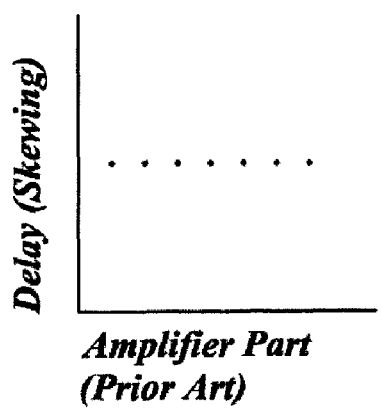
FIGS. 8a and 9a are diagrams of time delay through amplifier parts for a conventional DLNA and a DLNA according to the invention, respectively.
Figure 9A:
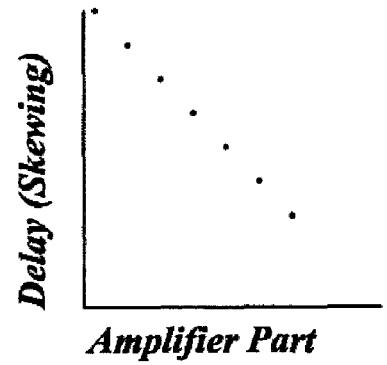
Figure 8B:
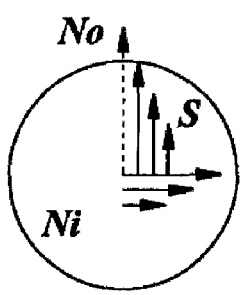
Figure 9B:
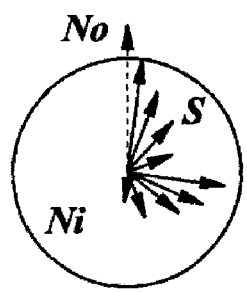
Figure 8C:
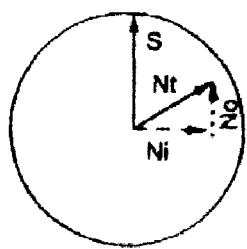
Figure 9C:
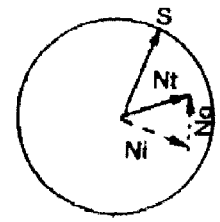
Figure 10A:
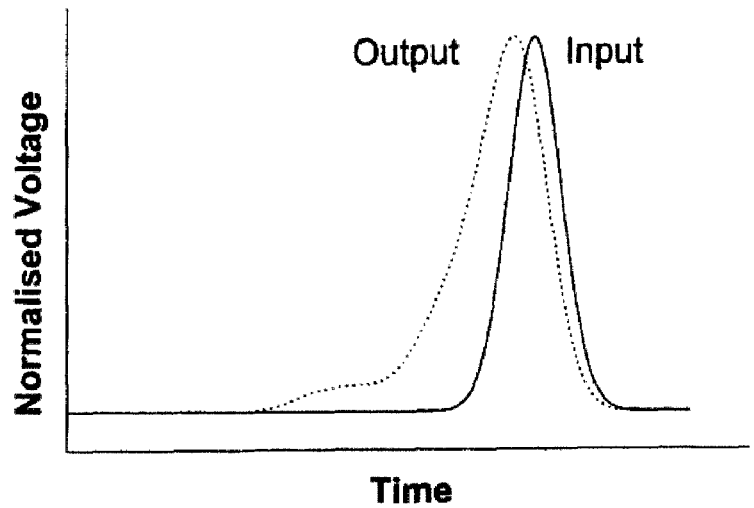
Figure 10B:
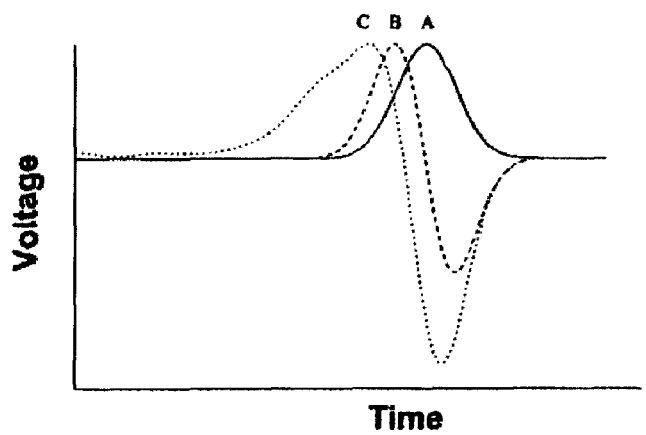
Figure 10C:
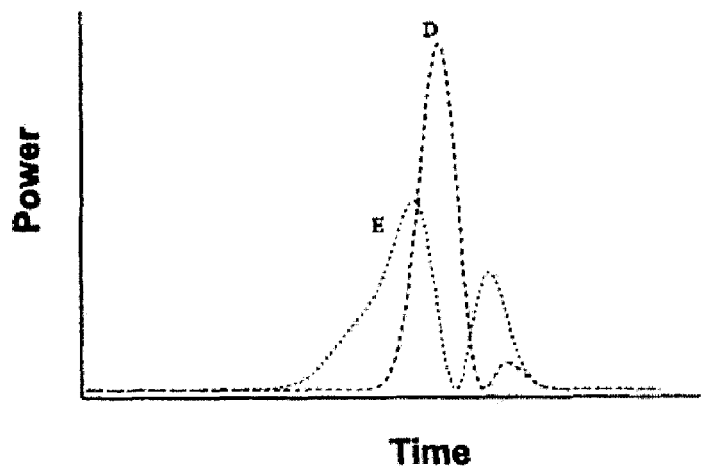
Figure 11:
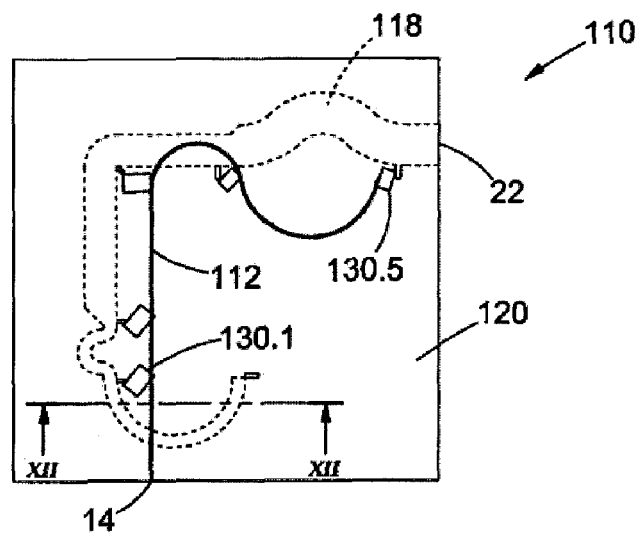
Figure 12:
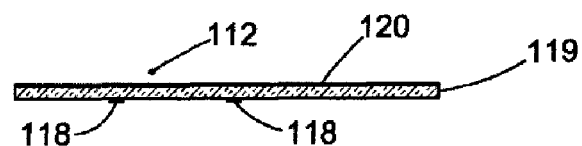
Figure 13:
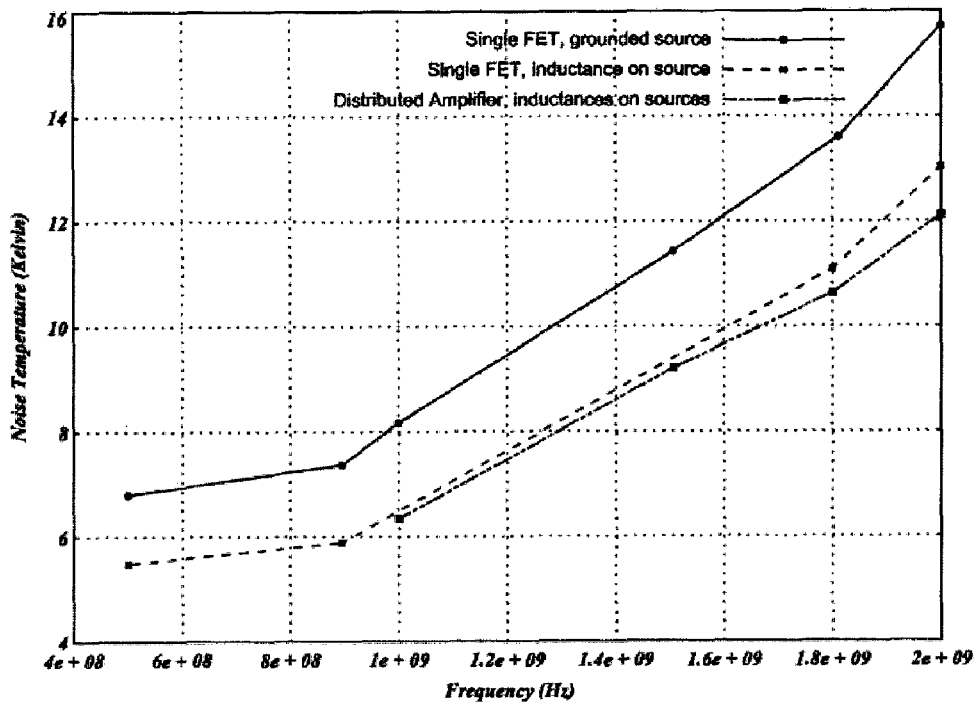
Figure 14:
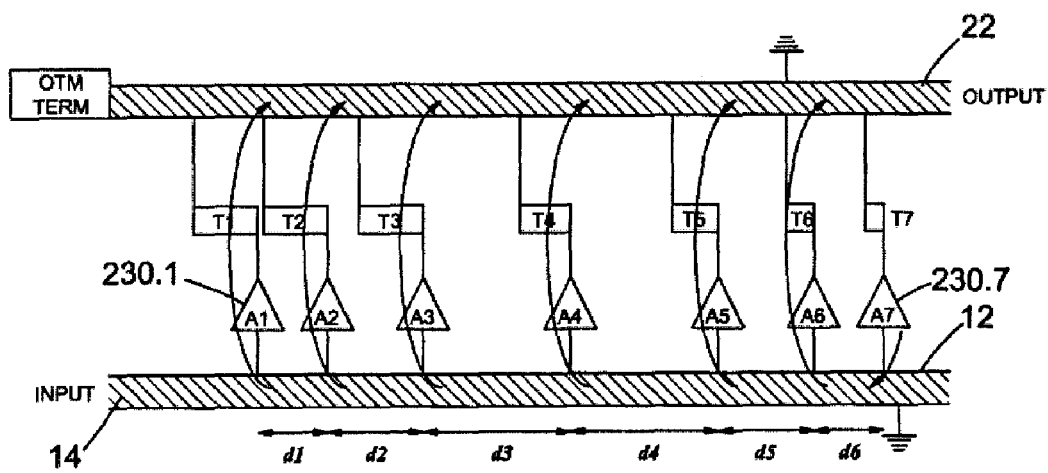
Figure 18:
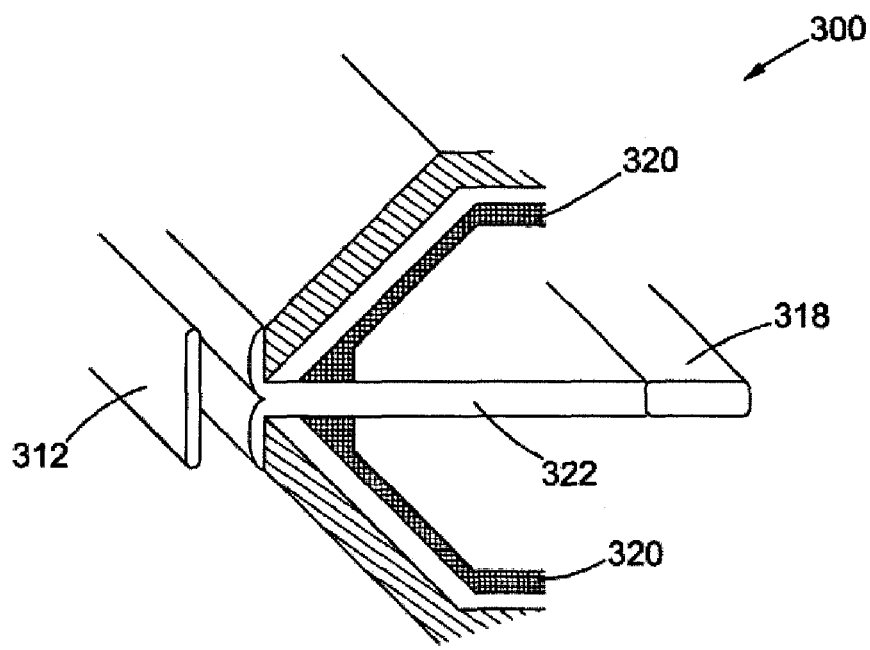
Figure 19:
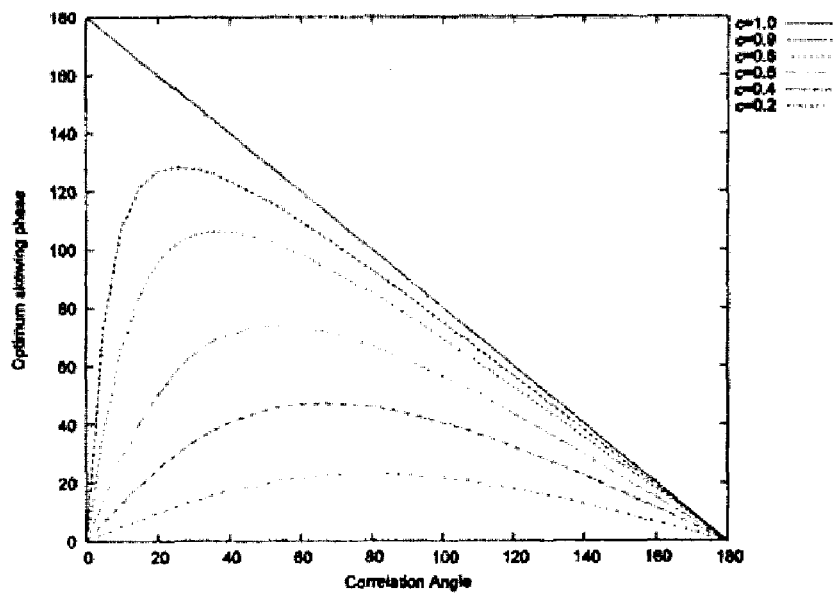

FIGS. 8*b* and 9*b* are phase diagrams of signal, input noise and output noise for the DLNA's in FIGS. 8*a* and 9*a* respectively;

FIGS. 8*c* and 9*c* are phase diagrams illustrating the signal as well as total noise and hence the effect of noise cancellation for the DLNA's of FIGS. 8*a* and 8*b* respectively;

FIG. 10*a* illustrates dispersion of the output signal of the DNLA in accordance with the invention;

FIG. 10*b* is a time domain representation of output noise and input noise for a conventional DLNA and a DLNA in accordance with the invention;

FIG. 10*c* is a diagram of noise power for a conventional DNLA and a DLNA in accordance with the invention;

FIG. 11 is a diagrammatic plan view of a physical layout of an alternative embodiment of a DNLA in accordance with the invention;

FIG. 12 is a section on line XII in FIG. 11;

FIG. 13 is a diagram of noise temperature against frequency illustrating how the noise figure may be reduced by using an inductor to ground the source of a field effect transistor (FET) and amplifier parts of the DNLA in accordance with the invention;

FIG. 14 is a diagrammatic representation of a DLNA in accordance with the invention, illustrating input noise propagating towards the input of the DLNA;

FIGS. 15*a* and 16*a* are diagrams of time delay through amplifier parts for a conventional DLNA and a DLNA according to the invention, respectively;

FIGS. 15*b* and 16*b* are phase diagrams of signal, input noise and output noise for the DLNA's in FIGS. 15*a* and 15*b* respectively;

FIG. 17 is a diagram of another DLNA in accordance with the invention comprising first and second inputs on a common input transmission medium, two sets of amplifier parts and first and second output transmission media;

FIG. 18 is a diagrammatic representation of yet another embodiment of the DNLA in accordance with the invention;

FIG. 19 is a graph of optimum skewing phase against correlation angle; and

Figure 20:
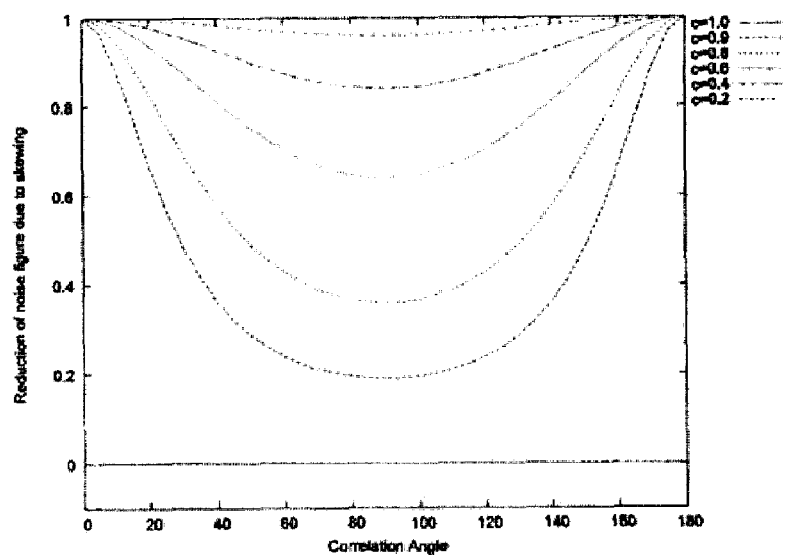

FIG. 20 is a graph of reduction of noise figure due to skewing against correlation angle.

FIG. 21 is Table 1 described earlier in specification.

DESCRIPTION OF A PREFERRED EMBODIMENT OF THE INVENTION

Figure 1:
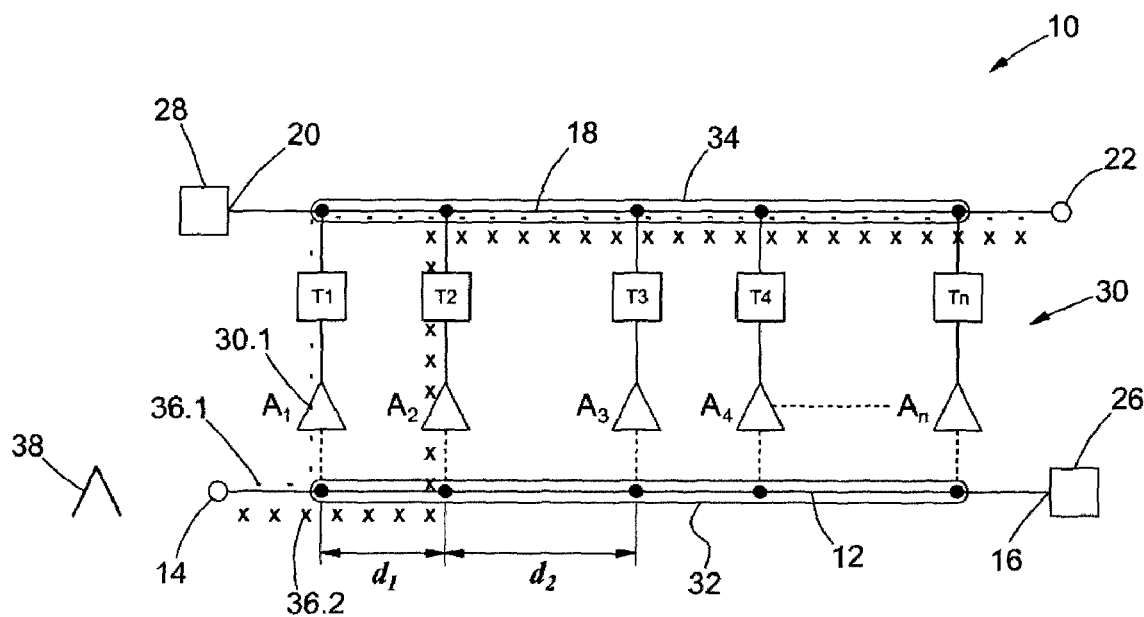
FIG. 1 is a high level diagram of the distributed low noise amplifier (DLNA) according to the invention.

A distributed low noise amplifier (DLNA) according to the invention is generally designated by the reference numeral 10 in FIG. 1. The DLNA has an amplification bandwidth 11 (shown in FIG. 2) extending between a first frequency f1 and a second frequency f2.

Referring to FIG. 1, the DLNA comprises an input transmission medium (ITM) 12 having a first end 14 and a second end 16. The DLNA further comprises an output transmission medium (OTM) 18 having a first end 20 and a second end 22. An input of the DLNA is provided at end 14 and an output at end 22. Suitable termination means 26 and 28 may be provided at the second end 16 of the ITM 12 and at the first end 20 of the OTM 18. The DLNA comprises an amplifier arrangement 30 comprising at least first and second amplifier parts 30.1 to 30.*n* connected at an input 32 of the arrangement to the input transmission medium and at an output 34 of the arrangement to the output transmission medium, to provide at least first and second paths 36.1 and 36.2 for an input signal 38 from the input 14 of the distributed amplifier to the output 22 of the distributed amplifier. Each of the first and second paths 36.1 and 36.2 being associated with a respective change in phase which is different and wherein the difference is larger than 30 degrees for frequencies in a noise suppression band, to cause a phase difference between noise generated by the amplifier arrangement 30 propagating along the first path and second paths and destructive interference of that noise before the output 22 of the distributed amplifier 10, thereby to suppress noise in the noise suppression band 13.

As shown in FIG. 1, in preferred embodiments, more than just the first and second amplifier parts 30.1 and 30.2 are so provided between the ITM and the OTM. A gain Al of the first amplifier part is different from a gain A2 of the second amplifier part. In a preferred embodiment, the respective gains of at least some adjacent amplifier parts decrease, for example linearly, alternatively exponentially, in a direction from the input 14 of the DLNA towards the output 22 thereof, i.e. A1>A2>A3 . . . >An.

Figure 2:
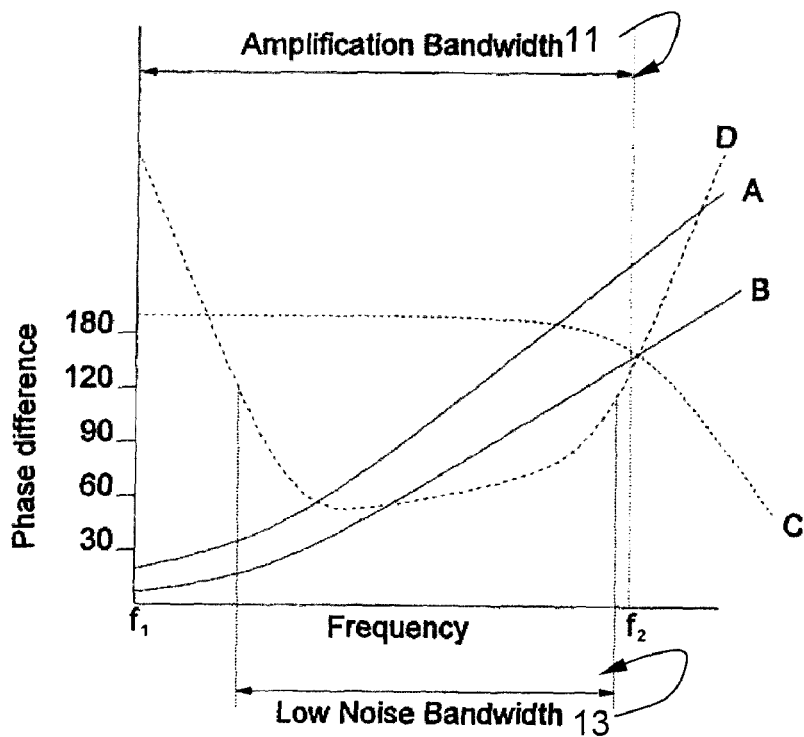
FIG. 2 is a graph illustrating various features of the DLNA according to the invention.

FIG. 2 illustrates various features of a distributed DLNA 10 according to the invention. Curve B shows the phase difference between the first amplifier part 30.1 and an intermediate amplifier part, Curve A shows the phase difference between the first amplifier part 30.1 and the last amplifier part 30.*n*. Curve C shows the gain profile, which is nearly constant over the amplification bandwidth 11. Curve D shows the noise figure of the DLNA 10. It is low within the noise suppression or low noise bandwidth 13. At frequencies lower than the noise suppression bandwidth 11, the phase difference between parts is small. These small differences give only little noise cancellation. At high frequencies, when the phase difference becomes close to 180 degrees, the gain of the amplifier starts to decrease, as the signal from the different parts start to cancel each other. This decreased gain then gives rise to an increase in the noise figure.

As background, in High Electron Mobility Transistors (HEMT), conventionally used in DLNA's, noise generated in the channel of the transistor is coupled capacitively to the gate terminal, but resistively to the drain terminal. This gives an almost 90° phase difference between input noise (at the gate) and output noise (at the drain), so that $C_r \ll C_i$. Almost no noise cancellation then takes place in a conventional distributed amplifier, resulting in a much higher noise figure than in harmonic amplifiers, as referred to in the introduction of this specification.

Figure 4:
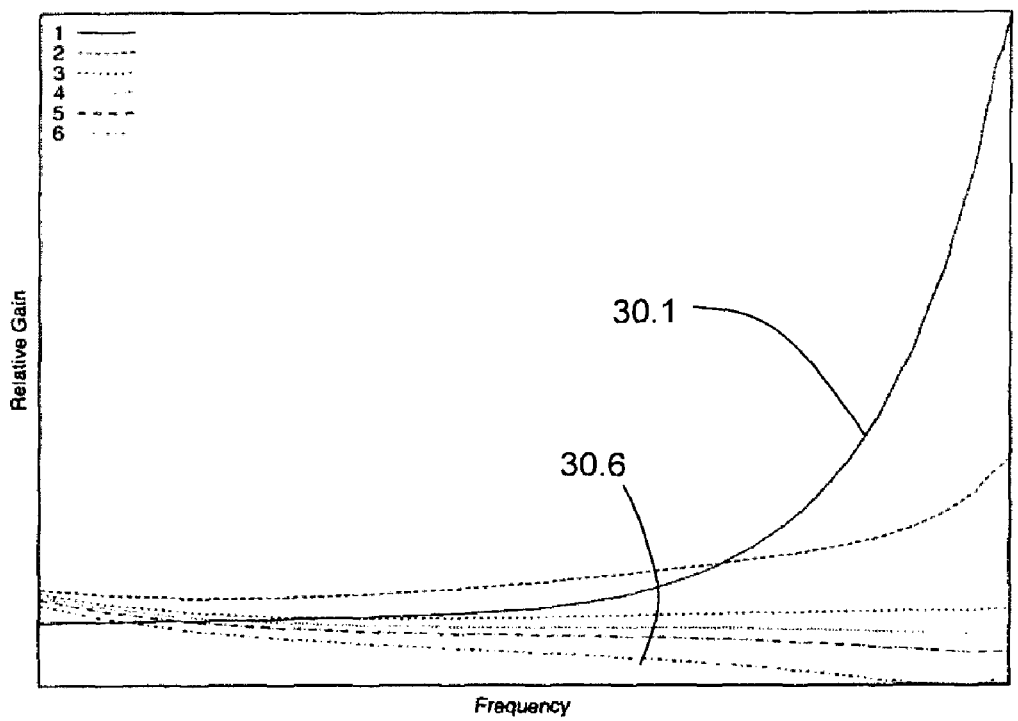
FIG. 4 is a diagram of relative gain against frequency for amplifier parts forming part of the amplifier.
Figure 5:
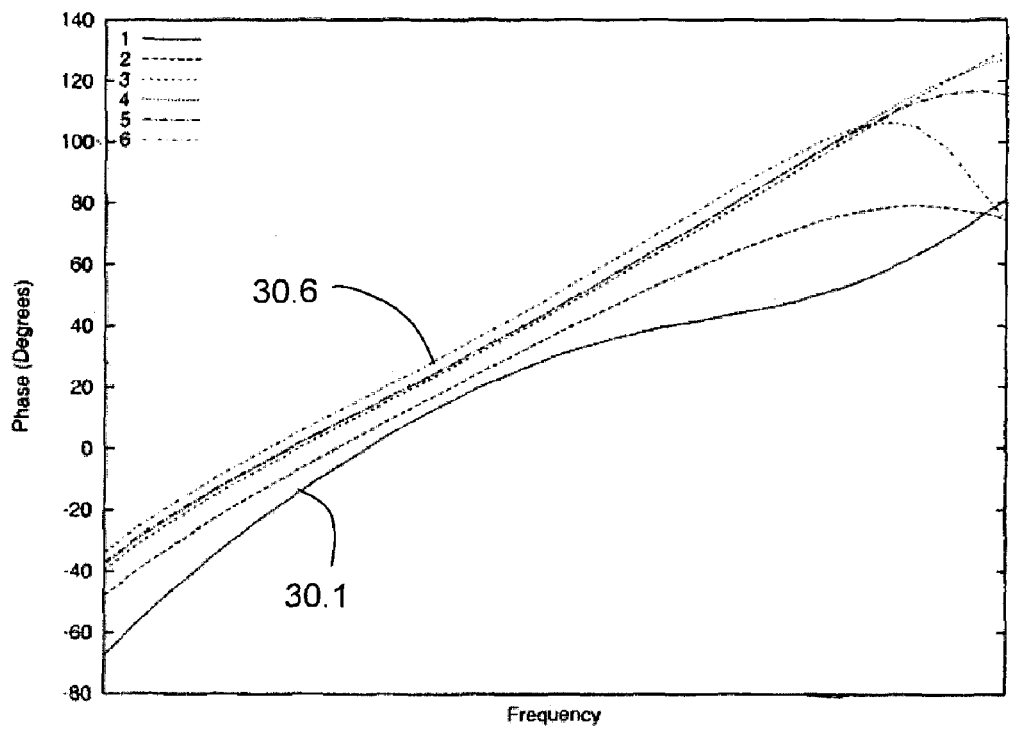
FIG. 5 is a diagram of phase change against frequency for the amplifier parts of the amplifier.
Figure 6:
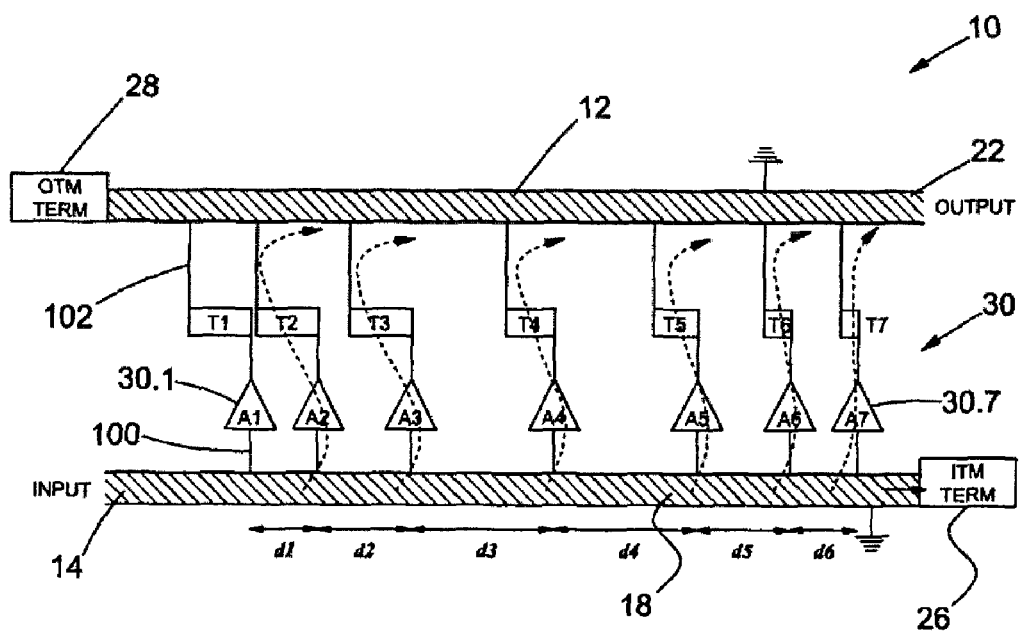
FIG. 6 is another diagrammatic representation of a DLNA in accordance with the invention.

Because the input noise is higher at higher frequencies, the gain of the parts may decrease faster at higher frequencies than at lower frequencies. FIGS. 4 and 5 illustrate typical gain and phase profiles respectively against frequency, for parts 30.1 to 30.6 of a DLNA 10 according to the invention.

A DLNA 10 according to the invention has different time delays from the input 14, through each amplifier part, to the output 22. The relation between time delay T and phase delay a is a=360 fT degrees, at a frequency f. An input signal 38 amplified by the amplifier parts, does not arrive at the same time at the output 22, and therefore does not add in phase. This phase difference is referred to as skewing.

This skewing changes the phase between the aforementioned output noise and aforementioned amplified input noise. With skewing, the correlation between the output noise and amplified input noise can be increased from about 90° to about 180°, resulting in better noise cancellation. For an optimum skewed distributed amplifier with many parts, the noise figure may be the same as for harmonic amplifiers (proportional to $\sqrt{1-C_{im}^2}-C_{re}$) (See Table 1).

Figure 7A:
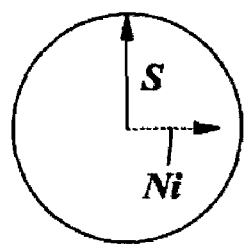
FIGS. 7a and 7b are phase diagrams of signal, input noise and output noise for the DLNA's in FIGS. 8a and 8b respectively.
Figure 7B:
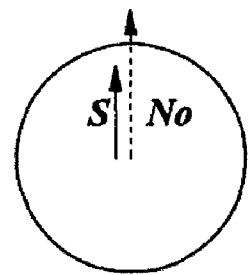

This technique will be explained by making use of the example in FIGS. 6 to 9. The phase diagrams in FIGS. 7*a* and 7*b* show the input noise $N_i$ at point 100 in FIG. 6 and output noise $N_o$ at point 102 respectively generated by amplifier part

30.1, compared to an input signal S. We assume that the input noise is correlated with the output noise, but has a phase difference, which is about 90° in this example. FIGS. 8a and 9a show the time delay from the input 14 to the output 22 through each amplifier part 30.1 to 30.n, for a conventional distributed amplifier and a skewed distributed amplifier 10 according to the invention. In the conventional case, shown in FIG. 8a, there is no time difference, with the result that all the signal (and noise) travelling on the input transmission medium is in phase when arriving at the output. The amplified input noise $N_i$ is therefore still 90° out of phase with the output noise $N_o$. Because they are correlated, they are added, as shown by $N_t$ in FIG. 8c. When some skewing is added, as shown in FIG. 9a, the signal takes longer to travel from the input 14, through each part, to the output 22, the closer the amplifier parts are to the input. The result is that the signals (and amplified input noise) arriving at the output 22 are slightly out of phase, as shown in FIG. 9b. The resulting amplified input noise is then more than 90° out of phase with the output noise, which results in some noise being cancelled. The total noise $N_t$ compared to the signal arrow in FIG. 9c, is therefore smaller than in the case with no skewing, see FIG. 8c.

The signals arriving out of phase at the output 22 due to the skewing, may distort the pulse response of the amplifier 10. FIG. 10a shows the dispersion of the output signal compared to the input signal, showing how the skewing has broadened the pulse. If the original pulse shape is required, the output signal may be de-dispersed after the amplifier 10. For a skew DLNA 10, FIG. 10b illustrates (in the time domain) what happens to the noise of the first amplifier part 30.1 compared to that of a conventional DNLA, which has no skewing. Curve A is the output noise and curve B is the correlated input noise, having a 90° phase shift. The amplified input noise will look the same (curve A) when there is no skewing and look like curve C, with skewing. This amplified input noise is added to the output noise. Because of the skewing, a large part of the output noise is cancelled by the amplified input noise. This can be seen, by comparing in FIG. 10c, the noise power for a case with skewing shown by curve E, to curve D for the case where there is no skewing. The output noise with no skewing has more high frequency noise than the output noise for an amplifier 10 with the correct skewing.

For a transmission medium 12, 18, the time delay T is normally frequency independent. The time delay through an amplifier part 30.1 to 30.n is normally frequency dependent.

For a frequency independent time delay difference between two amplifier parts, the phase delay difference becomes more, the higher the frequency. The result is that the amplifier's gain falls with frequency when the amplifier parts have a frequency independent gain. This can be corrected for by increasing the gain of the amplifier parts for higher frequencies.

The phase/time delay from the input 12, through an amplifier part 30.1 to 30.n, to the output 22 is the sum of three components namely, a first delay part from the input 12 of the amplifier to an input of the amplifier part, a second delay part through the amplifier part and a third delay part from the output of the amplifier part to the output 22 of the amplifier.

Skewing can be implemented in a number of ways. It can be implemented by selecting or manipulating the delay through the amplifier parts, or a delay between the amplifier parts on the transmission mediums, or a combination of the two.

In the amplifier part, the delay can be implemented by a source inductance and/or some extra time delay circuit.

When implemented by the transmission mediums, the time delay between parts on the input and output transmission medium must be different. This is most easily done by using different dielectric materials, thereby having mediums with different speeds. The input and output transmission medium lengths between two parts may also be made different.

For a transmission medium having speed v and length l, the delay is given by d=l/v. In a skew distributed amplifier with a maximum or second frequency of 2 GHz, the delay must be larger than d>125 ps for a 90° phase shift at 2 GHz. If the transmission speed is half the speed of light, the length l>19 mm to reach this skewing. Note that this is too long to be implemented in an MMIC.

If the transmission mediums have the same length, but the output medium with speed $v_o$ differs from the input transmission medium with speed $v_i$, the difference in time delay is $d=l(1/v_o-1/v_i)$ or $l=dv_ov_i/(v_i-v_o)$. If the speed of input transmission medium is that of light and output medium half that of light, then l=dc. For d>125 ps, l>38 mm is required.

FIGS. 11 and 12 show the physical layout of a skewed distributed amplifier 110, which has five amplifier parts 30.1 to 130.5. The output transmission medium 118 is a microstrip transmission medium on FR4 PCB 119, with a ground plane 120 on the one side and the output transmission medium 118 on the other side. The relative permittivity of FR4 is about 4, resulting in a transmission medium speed of about half the speed of light.

The input transmission medium comprises a 0.6 mm silver wire 112 suspended in air above the ground plane of the PCB. Because of the gate capacitance of the transistors, the transmission medium speed is a little slower than the speed of light, but still much faster than the output transmission medium speed.

The transmission medium lengths between amplifier parts are between 5 mm and 20 mm, which was found to be optimum for minimum noise between 0.5 GHz and 2 GHz. The last part 130.5 has drain-gate feedback to terminate the input transmission medium 112. The drains of the transistors are coupled to the output transmission medium through resistors that increase from 15Ω to 250Ω. The DC biasing circuit is not shown. The sources of the transistors are grounded with a DC-blocking capacitor, having an inductance of about 0.4 nH.

The first amplifier part 30.1 in a DLNA 10 normally comprises a HEMT, with the gate of the HEMT connected to the input transmission medium 12, the source grounded and the drain connected, through other components or a second amplifier stage, to the output transmission medium 18.

Besides the gate noise that is transferred to the input transmission medium (input noise) and the drain noise that is transferred to the output transmission medium (output noise), a third noise signal leaves the transistor through the source terminal. This source noise current is 180° out of phase with the drain noise current. When grounding the source through some impedance $Z_s$, a source noise voltage is generated $v_{s,n}=Z_si_{s,n}$. This source noise voltage is amplified (as in a common gate amplifier) and this amplified source noise is added to the drain noise. If the right source impedance is chosen (such as an inductance) the amplified source noise will cancel some of the drain noise. FIG. 13 shows how the minimum noise figure (measured as a noise temperature) of a transistor is reduced by grounding the source through an inductor.

The inductance on the source may have the disadvantage of making the transistor unstable, normally at frequencies higher that the amplifier's bandwidth. Therefore, a smaller source inductance than optimum may be used.

The source grounding inductance may also be used in a skewed distributed amplifier in accordance with the invention. The combination of the noise cancellation due to the source inductor and skewing gives an even lower noise figure than that of a harmonic amplifier. It was found that the minimum noise figure is achieved when the grounding inductance is increased for each amplifier part in a direction from the input 14 to the output of the amplifier. FIG. 13 shows the minimum noise figure of a skewed distributed amplifier with increasing source inductance. Because of the decreasing gain of the amplifier parts, the larger inductances do not necessary lead to an instability.

Note that by increasing the source inductance, the phase delay through the amplifier parts differs, which contributes to the skewing.

It is well known that noise of a termination element at the second end 16 of the input transmission medium 12 has an important effect on the amplifier's noise at low frequencies. It is also known that when using a transistor as active terminator, a lower termination noise is generated than when using a resistance. U.S. Pat. No. 5,365,197 teaches one such a technique. The active termination can be seen as the input of an amplifier, with the output fed back to the input through a feedback circuit that determines the termination impedance. The output of the termination amplifier may also be added to the output transmission medium, making the termination amplifier the last part. By using the last amplifier part 30.$n$ as a cold terminator, an extra amplifier as terminator is not required. This can only be done in a decreasing gain amplifier, because the termination feedback reduces the gain of the amplifier 10, As shown in FIG. 14, part of the noise added to the input transmission medium 12 by the amplifier parts 230.1 to 230.7 propagates in the direction of the input 14. This noise is also amplified by the amplifier parts it passes. If the phase delay of the transmission medium between parts is a quarter wavelength, the phase difference between the amplified noise will be more than 180°, which will result in noise cancellation. Therefore, if skewing is implemented by using input and output mediums with different delay times between the parts, such that the difference in delay is comparable to a quarter of a wavelength, it would cause cancellation of backward noise. FIGS. 15 and 16 compare the amplified backward noise generated by the last amplifier part 230.7 for a first distributed amplifier with a small delay on the transmission mediums (FIGS. 15$a$ and 15$b$) and a second distributed amplifier with delays comparable with a quarter of a wavelength on the transmission mediums (FIGS. 16$a$ and 16$b$).

Because a signal propagating in the wrong or opposite direction on the input transmission medium 12 cancels out at the output, it is possible to use the input transmission medium 12 for two skewed distributed amplifiers 400, as shown in FIG. 17. The input transmission medium 12 is then terminated at first and second ends thereof by a first and second input respectively. In some applications, as in radio astronomy, the input has very little noise and is therefore a good low noise terminator. The isolation between the two amplifiers inputs over a broad bandwidth is proportional to the inverse of the number of amplifier parts. Many amplifier parts are therefore required for good isolation.

FIG. 18 shows an example of a continuous amplifier 300, using a continuous dual gate FET, and which the applicant believes would provide a low noise figure. A first gate 312 of the FET forms the input transmission medium, with the drain 318 of the FET forming the output transmission medium. By using different dielectric mediums for the gate and drain lines, the speed can be made different, giving rise to skewing.

The decreasing gain may be implemented by tapering the drain line, changing the resistance of the second gate 320 or changing the resistance of the semiconductor 322 between the second gate and drain 318.

Referring again to FIG. 1, let a first amplifier part 30.1 have a phase delay of $\theta_1$ through the amplifier 10 and a second amplifier part 30.2 have a phase delay of $\theta_2$. The difference in phases (or skewing angle) is then $\theta_s = \theta_2 - \theta_1$. The effect of this skewing angle on the noise figure due to the noise of the first amplifier part 30.1 will now be considered.

For simplicity, let's assume the amplifier parts have the same gain $A_i$. The gain of the amplifier 10 due to these two amplifier parts is $$A = A_i[(1+\cos(\theta_s))^2 + \sin^2(\theta_s)].$$

Let the first amplifier part 30.1 have an output noise which propagate to the output terminal 22, and an input noise, which is amplified by the second part 30.2, giving a noise $i_i$ the output 22. Again for simplicity, we assume the output noise and amplified input noise to have the same magnitude at the output 22, that is $\overline{i_v^2} = \overline{i_i^2}$. The (not skewed) amplified input noise can be divided into three parts: a correlated part that is in-phase with the output noise, a correlated part that is 90-degrees out of phase with the output noise and an uncorrelated part. $i_i = i_o c_r + i_o c_i + i_{i,u}$.

The total output noise due to the first amplifier part 30.1 then also has three corresponding components:

$$N = \overline{i_o^2}(1 + c_r \cos(\theta_i) + c_i \sin(\theta_s))^2 + \overline{i_u^2}(c_i \cos(\theta_s) + c_r \sin(\theta_s))^2 + \overline{i_{i,u}^2}.$$

If $c$ is the magnitude of the correlation coefficient and $\theta_c$ the correlation phase, $c_r = c \cos(\theta_c)$ and $c_i = c \sin(\theta_r)$.

The noise figure F for a skewing phase $\theta_s$ is then proportional to $N/A$, giving $$F(\theta_s) \alpha \frac{\overline{i_o^2}}{A_1} \frac{1 + c[\cos(\theta_c)\cos(\theta_s) - \sin(\theta_c)\sin(\theta_s)]}{1 + \cos(\theta_s)}.$$

This noise figure has a minimum when the skewing phase $\theta_s$ is chosen such that $$\frac{1 + \cos(\theta_{s,opt})}{\sin(\theta_{s,opt})} = \frac{1 - c\cos(\theta_c)}{c\sin(\theta_c)}.$$

FIGS. 19 and 20 show the optimum skewing phase $\theta_{s,opt}$ and the corresponding reduction in noise figure between a skewed and not-skewed amplifier $F(\theta_{s,opt})/F(O)$ for different correlation coefficients, When the optimum skewing angle is less than about 30°, skewing does not significantly reduce the noise figure.

A typical low noise High Electron Mobility Transistors (HEMT), like agilents ATF35143, has a correlation coefficient of about $c=0.9$ and a correlation angle of about $\theta_c=90°$. When using such a transistor for the first amplifier part 30.1, the optimum skewing phase is about 90 degrees and it reduces the first amplifier parts noise figure with a factor of 5. In practice, due to the noise of the second amplifier part 30.2, the optimum skewing reduce the noise figure of the amplifier 10 with a factor of about $1/\sqrt{1 - c_i^2} \approx 2$.

Figure 3:
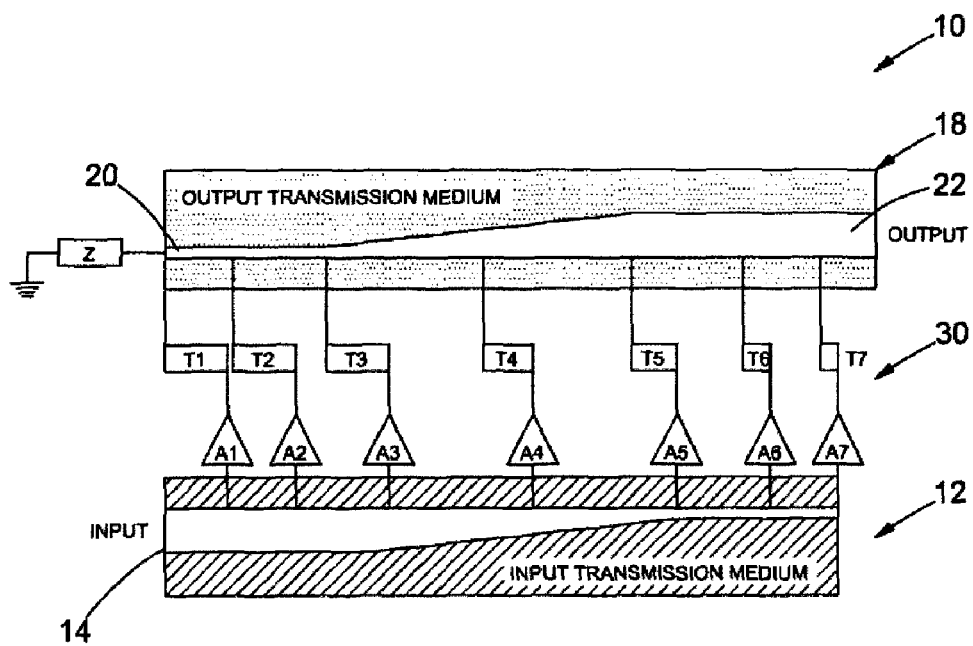
FIG. 3 is a diagrammatic representation of one embodiment of the DLNA according to the invention.

FIG. 3 is a diagrammatic illustration of another embodiment of a skewed amplifier 10 according to the invention. An impedance of the output transmission medium 18 decreases in a direction from the first end 28 thereof to the output 22 of the amplifier. An impedance of the input transmission medium 12 increases in a direction from the first end 14 of the first transmission medium to the second end 16 thereof.

What is claimed is:

1. A distributed amplifier having an amplification bandwidth extending from a first frequency to a second frequency higher than the first frequency, the distributed amplifier comprising:
    an input transmission medium having a first end and a second end and providing an input for the distributed amplifier at the first end;
    an output transmission medium having a first end and a second end and providing an output for the distributed amplifier at the second end;
    an amplifier arrangement comprising at least first and second amplifier parts connected at an input of the arrangement to the input transmission medium and at an output of the arrangement to the output transmission medium, the amplifier arrangement configured to provide at least first and second paths for an input signal from the input of the distributed amplifier to the output of the distributed amplifier;
    the first path being associated with a first phase change, the second path being associated with a second phase change and there being a difference between the first phase change and the second phase change; and
    the difference being larger than 30 degrees for frequencies in a noise suppression band overlapping with the amplification band overlapping with the amplification band so as to cause a phase difference between noise generated by the amplifier arrangement propagating along the first and second paths and destructive interference of the noise before the output of the distributed amplifier, thereby to suppress noise in the noise suppression band.

2. A distributed amplifier as claimed in claim 1, wherein the first phase change and the second phase change are caused by each of the first and second paths being associated with a first time delay and a second time delay, respectively, and
    wherein a difference between the first time delay and the second time delay is larger than an inverse of twelve times the second frequency.

3. A distributed amplifier as claimed in claim 1, wherein an amplifier part of said at least two amplifier parts which is closest to the output of the amplifier is used at the second end of the input transmission medium, to terminate the input transmission medium.

4. A distributed amplifier as claimed in claim 1, wherein an impedance of the output transmission medium decreases in a direction from the first end of the output transmission medium to the second end thereof.

5. A distributed amplifier as claimed in claim 1, wherein an impedance of the input transmission medium increases in a direction from the first end of the input transmission medium to the second end thereof.

6. A distributed amplifier as claimed in claim 1, wherein each amplifier part comprises at least one field effect transistor (FET) having a gate, a source and a drain, wherein the gate is connected to the input transmission medium, the drain is connected to the output transmission medium and the source is grounded.

7. A distributed amplifier as claimed in claim 6, wherein the source of each FET is connected through a respective inductor to ground.

8. A distributed amplifier as claimed in claim 7, wherein the values of the inductors increase in a direction from the input of the amplifier to the output thereof.

9. A distributed amplifier as claimed in claim 1, wherein the respective gains of the amplifier parts decrease in a direction from the input of the amplifier to the output thereof.

10. A distributed amplifier as claimed in claim 9, wherein the respective gains of at least some adjacent amplifier parts decrease exponentially.

11. A distributed amplifier as claimed in claim 9, wherein each amplifier part comprises a gain adjustment circuit configured to cause the respective gains to decrease.

12. A distributed amplifier as claimed in claim 11, wherein the gain adjusting circuit comprises one or more of a capacitor, resistor, inductor and field effect transistor connected between an output of the amplifier part and the output transmission medium.

13. A distributed amplifier as claimed in claim 11, wherein the gain adjustment circuit comprises one of a circuit for biasing respective amplifying devices of the amplifier parts differently, and the amplifier parts comprising suitably different amplifying devices.

14. A distributed amplifier as claimed in claim 1, wherein the phase difference is effected by the input transmission medium and the output transmission medium comprising respective different dielectric materials.

15. A distributed amplifier as claimed in claim 1, wherein the spacing between at least two immediately adjacent amplifier parts on the input transmission medium is different from that of any other two amplifier parts.

16. A distributed amplifier as claimed in claim 1, wherein the spacing between at least two immediately adjacent amplifier parts on the output transmission medium is different from that of any other two amplifier parts.

17. A method of reducing noise generated by a distributed amplifier having an amplification bandwidth extending from a first frequency to a second frequency higher than the first frequency, the distributed amplifier comprising an input transmission medium having a first end and a second end and providing an input for the distributed amplifier at the first end; an output transmission medium having a first end and a second end and providing an output for the distributed amplifier at the second end; an amplifier arrangement comprising at least first and second amplifier parts connected at an input of the arrangement to the input transmission medium and at an output of the arrangement to the output transmission medium, the amplifier arrangement configured to provide at least first and second paths for an input signal from the input of the distributed amplifier to the output of the distributed amplifier, the method comprising the steps of:
    causing a first phase change in the first path;
    causing a second phase change in the second path; and
    the second phase change being different from the first phase change by a difference larger than 30 degrees for frequencies in a noise suppression band overlapping with the amplification band so as to cause a phase difference between noise generated by the amplifier arrangement propagating along the first and second paths and destructive interference of the noise before the output of the distributed amplifier, thereby to suppress noise in the noise suppression band.

18. A distributed amplifier having an amplification bandwidth extending from a first frequency to a second frequency higher than the first frequency, the distributed amplifier comprising:
    an input transmission medium having a first end and a second end and providing an input for the distributed amplifier at the first end;

an output transmission medium having a first end and a second end and providing an output for the distributed amplifier at the second end;

an amplifier arrangement comprising at least a first amplifier part and a second amplifier part, and connected at an input of the arrangement to the input transmission medium and at an output of the arrangement to the output transmission medium, the amplifier arrangement configured to provide at least a first path and a second path for an input signal from the input of the distributed amplifier to the output of the distributed amplifier; and the first path being associated with a first time delay, the second path being associated with a second time delay, wherein a difference exists between the first time delay and the second time delay, the difference being larger than an inverse of twelve times the second frequency so as to cause a phase difference between noise generated by the amplifier arrangement propagating along the first and second paths and destructive interference of the noise before the output of the distributed amplifier, thereby to suppress noise in a noise suppression band overlapping with the amplification band.

* * * * *